United States Patent
Yudin et al.

(10) Patent No.: US 10,218,152 B1
(45) Date of Patent: Feb. 26, 2019

(54) SEMICONDUCTOR LASER DIODE WITH LOW THRESHOLD CURRENT

(71) Applicant: Sharp Kabushiki Kaisha, Osaka (JP)

(72) Inventors: Alex Yudin, Oxford (GB); Yoshihiko Tani, Osaka (JP); Valerie Berryman-Bousquet, Oxford (GB); Shigetoshi Ito, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 15/683,188

(22) Filed: Aug. 22, 2017

(51) Int. Cl.
*H01S 5/34* (2006.01)
*H01S 5/343* (2006.01)
*H01S 5/22* (2006.01)

(52) U.S. Cl.
CPC ............ *H01S 5/34333* (2013.01); *H01S 5/22* (2013.01); *H01S 5/3407* (2013.01)

(58) Field of Classification Search
CPC .......... H01S 5/34333; H01S 5/34; H01S 5/22; H01S 5/3407; H01S 5/3425
See application file for complete search history.

(56) References Cited

U.S. PATENT DOCUMENTS

| | | | |
|---|---|---|---|
| 7,705,364 B2* | 4/2010 | Lee | B82Y 20/00 257/104 |
| 9,123,851 B2 | 9/2015 | Goda et al. | |
| 2012/0128016 A1* | 5/2012 | Adachi | B82Y 20/00 372/43.01 |

FOREIGN PATENT DOCUMENTS

JP 4622466 B2 2/2011

OTHER PUBLICATIONS

Zhang et al., Confinement factor and absorption loss of AlInGaN based lasr diodes emitting from ultraviolet to green, Journal of Applied Physics 105, 023104 (2009).
Nakamura et al., The Blue Laser Diode, p. 201-221, 1997 (Berlin: Springer), InGaN single-Quantum-Well LEDs.

\* cited by examiner

*Primary Examiner* — Armando Rodriguez
(74) *Attorney, Agent, or Firm* — Renner, Otto, Boisselle & Sklar, LLP (57) ABSTRACT

A group III nitride based laser light emitting device includes an n-side group III nitride based semiconductor region, a p-side group III nitride based semiconductor region, and a group III nitride based active region between the p-side group III nitride based semiconductor region and n-side group III nitride based semiconductor region. The group III nitride based active region includes first and second quantum well layers and a barrier layer between the first and second quantum well layers, the respective compositions of the first and second quantum well layers comprising different respective amounts of indium. The first quantum well is closer to the n-side group III nitride based semiconductor region than the second quantum well, the second quantum well is closer to the p-side group III nitride based semiconductor region than the first quantum well, and the first quantum well has a larger band gap than the second quantum well.

20 Claims, 7 Drawing Sheets

Figure 7

SEMICONDUCTOR LASER DIODE WITH LOW THRESHOLD CURRENT

TECHNICAL FIELD

The present disclosure relates to the epitaxial structure of a semiconductor laser diode, and in particular to an active region structure of a III-nitride based semiconductor laser diode.

BACKGROUND ART

Laser Diodes (LDs) based on III-nitride semiconductors are commercially available with emitting wavelengths in the UV, blue and green portions of the electromagnetic spectrum. Such devices are used, for example, in illumination and display applications. It is particularly important to provide such devices with high electrical and optical performances.

Figure 1A:
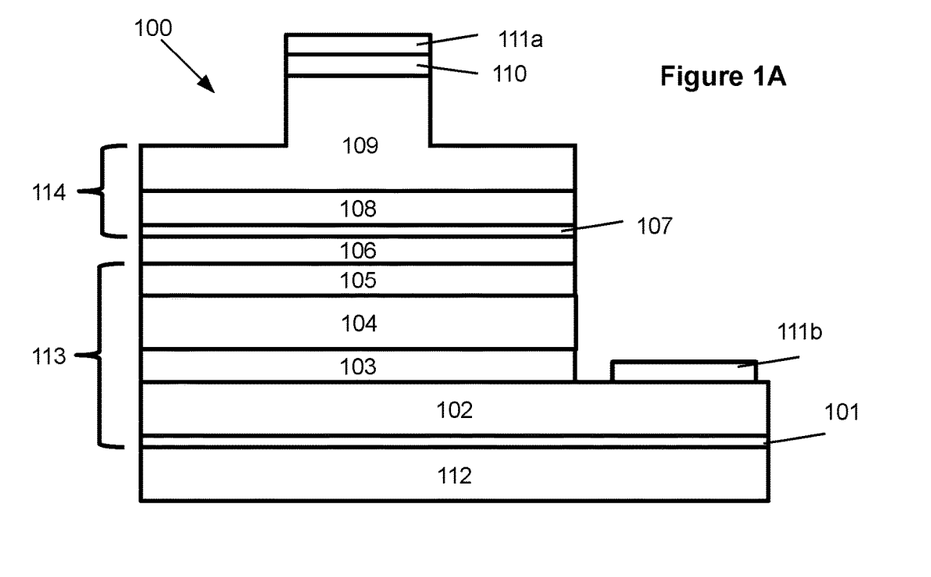
FIG. 1A shows a schematic representation of the layer structure of a conventional semiconductor laser diode device.

A III-nitride (or also nitride) semiconductor structure based on GaN and its alloys including In and Al (hereafter referred to as (Al,In,Ga)N alloys) can be made to form high efficiency LD devices. The semiconductor layer structure for such devices can be manufactured by forming semiconductor layers sequentially on a substrate. These layers are physically connected and generally obtained with high crystal quality using epitaxial deposition or growth method such as Metal Organic Chemical Vapor Deposition (MOCVD) or Molecular Beam Epitaxy (MBE). FIG. 1A shows such a conventional structure of a laser diode device as described by Nakamura S and Fasol G, The Blue Laser Diode, p. 293, 1997 (Berlin: Springer). The structure includes an n-side semiconductor region 113, active region 106 and p-side semiconductor region 114 formed on a substrate 112. The deposition direction or the growth direction is defined by the direction perpendicular to the semiconductor layers surface of this structure. The substrate is made of sapphire.

Under application of a low electrical excitation to this structure, charge carriers such as electrons and holes will move across the structure and recombine radiatively in the active region 106 resulting in emission of photons. The wavelength of the emitted photons and thus of the light emission from the LD device is determined by the bandgap of the active region.

Semiconductor laser diode devices as described above require confinement of the emitted photon and carrier recombination to an active region and a higher electrical excitation. Additionally, an optical cavity established by reflecting mirror surfaces at both ends of the device induces an optical amplification. Once these requirements are satisfied lasing operation can be achieved.

Confinement of the emitted photons can be achieved by the utilization of a separate confinement heterostructure. With continued reference to FIG. 1A, this may be achieved by arranging a n-guide layer 105 below and a p-guide layer 108 above the active region 106, each of the n-guide layer and the p-guide layer having a refractive index higher than the effective index of the guided light. Further confinement is achieved by arranging a n-cladding layer 104 below and a p-cladding layer 109 above the active region 106, each of the n-cladding layer and the p-cladding layer having a refractive index lower than the effective index of the guided light. The upper p-guide layer 108 and upper p-cladding layer 109 form part of the p-side semiconductor region 114. The lower n-guide layer 105 and lower n-cladding layer 104 form part of the n-side semiconductor region 113. The n-side semiconductor region 113 additionally includes buffer layer 101, n-contact layer 102, and a buffer layer 103.

This structure may lead to strong confinement of the emitted photons in a transverse direction, therefore propagating parallel to the active region. Between the active region 106 and upper p-guide layer 108, a carrier blocking layer 107 is provided, which has a wider band gap compared to adjacent layers.

The p-cladding layer 109 has a shaped upper surface that may be formed by post-growth processing. In a typical layout, the shaped upper surface of the p-cladding layer 109 is a ridge formed in the plane of growth, which enhances light confinement to the direction of the longest dimension of the ridge.

A p-contact layer 110 is formed on top of the upper p-cladding layer 109. Electrical contact is made to the p-contact layer 110 by a metal electrode layer 111a formed thereon, which allows the device to be electrically activated. Injection of charge carriers to the p-side semiconductor 114 only occurs in the area defined by the metal electrode layer 111a and the p-contact layer 110 which coincide with the shaped ridge. An electrode metal layer 111b is also formed on the surface of the n-contact layer 102, which can be achieved by etching through the semiconductor layer structure described herein by post growth processing and depositing a metal electrode layer on the n-contact layer 102.

At either end of the ridge, a surface perpendicular to the growth direction and the direction of the longest dimension of the ridge is defined by a process such as cleaving or etching. Light escaping by transmission through these surfaces is used for the intended applications. In this described arrangement, the device is said to be edge emitting.

Figure 1B:
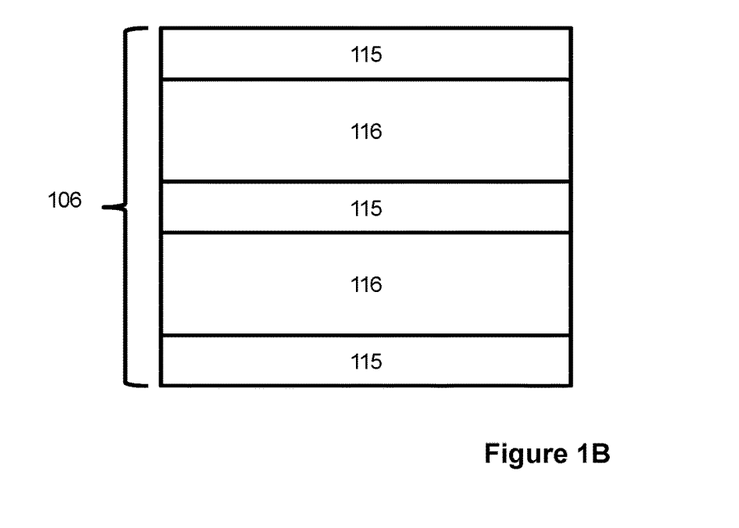
FIG. 1B shows a schematic representation of the layer structure of the active region of a conventional semiconductor laser diode device.
Figure 1C:
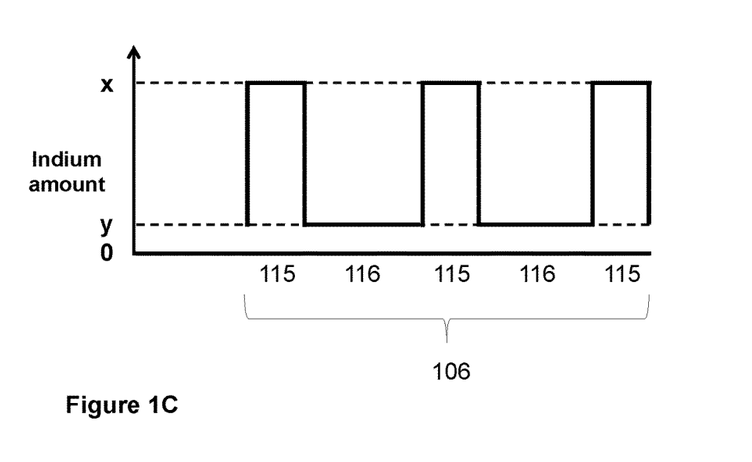
FIG. 1C shows a graph illustrating the respective amounts of indium in the layers of the active region of a conventional semiconductor laser diode device.
Figure 1D:
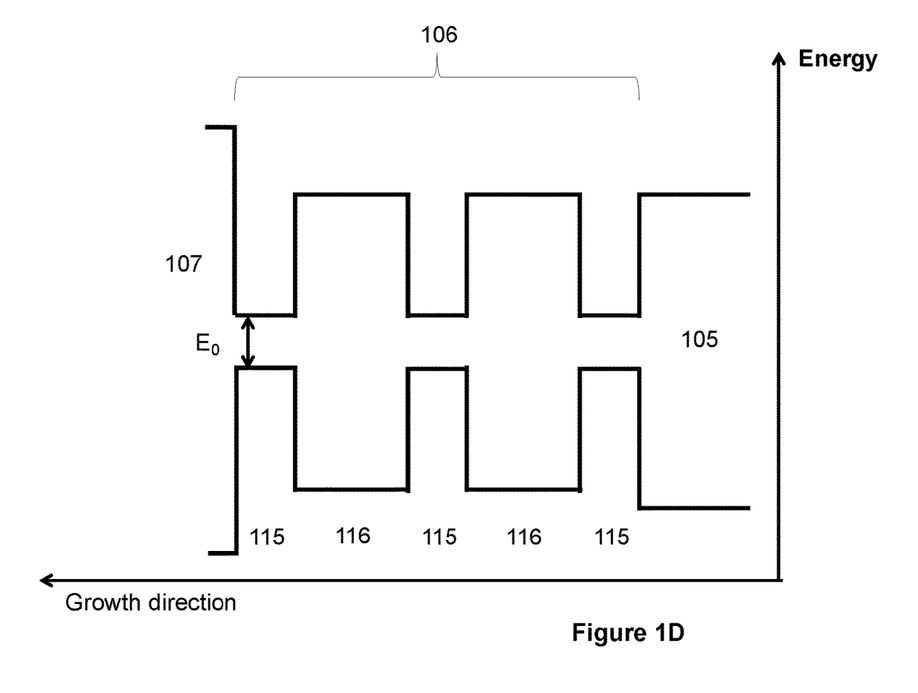
FIG. 1D shows a graph illustrating an energy band structure of layers in the active region of a conventional semiconductor laser diode device.

FIG. 1B shows the active region 106 of the semiconductor laser emitting device of FIG. 1A. The active region 106 is designed to confine recombination of charge carriers (electrons, holes), formed of a triple quantum well structure where semiconductor layers of low bandgap (quantum well layers 115) are arranged between layers of higher band gap (quantum barrier layers 116. The layers of the active region are formed of InGaN alloy semiconductor material. The band gap of InGaN material decreases as the amount of In increases. FIG. 1C shows the amount of In x in the composition for each quantum well layer 115 and the amount of In y in the composition for each quantum barrier layer 116. FIG. 1D shows the corresponding energy levels for electrons and holes. The energy E0 indicates the band gap of the quantum well layers 115.

Such quantum well structures are highly desirable for localizing recombination of carriers. However, in III-nitride material systems there is an issue of non-uniformity in carrier concentration across the quantum wells and this has an impact on the laser diode performance. For example, quantum wells 115 close to the n-side semiconductor region 113 have generally a much higher concentration of electrons than quantum wells 115 close to the p-side semiconductor region 114 under a given operating condition. Analogously, quantum wells closer to the p-side semiconductor region have a higher hole concentration than quantum wells close to the n-side semiconductor region. Non-uniformity in hole concentration is particularly pronounced due to their lower mobility as compared with electrons in this material system.

In addition, for achieving a laser diode device with emission wavelength longer than UV (>405 nm), it is typically necessary to decrease the bandgap of the quantum wells 115 in the active region 106. This has a consequence of increasing the confinement of electrons in the quantum wells 115 closer to the n-side semiconductor region 113 and holes in the quantum wells 115 closer to the p-side semiconductor region 114. This further contributes to increased non-uniformity of carriers across the quantum wells.

Lasing light emission is achieved when radiative recombination rate from carrier recombination in the active region reaches a level which is able to compensate for optical losses. This corresponds to a carrier concentration under a high electric excitation also known as threshold current. At this threshold, lasing will be achieved and the quantum wells contributing to this lasing process will be the one(s) with the highest radiative recombination rate. If non-uniformity exists among the quantum wells 115, the lasing process will be achieved at higher electric excitation and therefore at a higher threshold current.

In Nakamura S and Fasol G, The Blue Laser Diode, p. 201-221, 1997 (Berlin: Springer), non-uniformity in carrier distribution may be reduced by reducing the number of quantum well layers to, for example, one. However, in such an arrangement, a single quantum well layer is insufficient to localize all electrons injected to the active region 106 and significant flow of electrons is not confined in the active region and electrons are injected into the p-side semiconductor region 114. This leads to recombination of electrons and holes in the p-side semiconductor 114, in particular in the upper guide layer 108, thereby reducing injection of holes to the active region 106 and causing increase in threshold current. To reduce this overflow effect, a single quantum well structure with increased quantum well layer thickness may be used to increase the confinement of electrons in the quantum well layer. However, it is difficult to achieve InGaN based quantum well layers with high crystal quality when the thickness of these layers is increased. This has a consequence to increase defects in the quantum well layers which may be responsible for increasing non-radiative recombination rate and further increasing the threshold current of the laser emitting device.

In U.S. Pat. No. 9,123,851B2 (Goda et al, Sep. 1, 2015), the non-uniformity in carrier concentration of a multi quantum well structure may be addressed by reducing the thickness of quantum barrier layers 116 which are arranged between quantum well layers 115. However, in such structure, because the mobility of electrons is higher than that of the holes, the non-uniformity of electron concentration is enhanced and results in increased overflow of electrons to the p-side semiconductor region 114, in particular in the upper p-guide layer 108. This has a consequence to increase the recombination of electrons and holes in the p-guide layer and reduce the injection of holes to the active region. The laser light emitting device achieved with such structure may exhibit an increased threshold current.

In JP4622466B2 (Koji, Mar. 3, 2005), non-uniformity of carrier concentration across the quantum wells may be reduced by lowering the band gap energy of the barrier layers 116 compared to quantum well layers 115 to enhance transport of carriers through the barrier layers 116. However, in this case, transport of electrons past the barrier layers is improved to a greater extent than the transport of holes past the barrier layers, thus overall increasing overflow of electrons to the p-side semiconductor region 114, in particular in the upper p-guide layer 108.

Reducing the bandgap energy of the barrier layers 116 can be achieved by increasing the amount of In in the barrier layers 116 but this degrades the crystal quality of the active region, leading to higher levels of non-radiative recombination and increasing the threshold current of the laser diode device.

In Zhang et al. (Journal of Applied Physics 2009 105:2), improved performance may be achieved by reducing the absorption loss of photons in upper p-guide layer 108, lower n-guide layer 105, upper p-cladding layer 109, and lower n-cladding layer 104. This can be achieved by reducing the concentration of dopant species in these layers, which however negatively impacts hole injection from A-side semiconductor region and n-side semiconductor region into the active region.

There remains a problem of reducing threshold current of a III-nitride based semiconductor laser diode by improving carrier injection and carrier uniformity to the active region while maintaining strong light confinement and high crystal quality, and without degrading the characteristics of emitted laser light.

CITATION LIST

Patent Literature

U.S. Pat. No. 9,123,851B2 (Goda et al, Sep. 1, 2015).
JP4622466B2 (Koji, Mar. 3, 2005).

Non-Patent Literature

Nakamura S and Fasol G, The Blue Laser Diode, p. 201-221, 1997 (Berlin: Springer).
Zhang et al., Confinement factor and absorption loss of AlInGaN based laser diodes emitting from ultraviolet to green, Journal of Applied Physics 105, 023104 (2009).

SUMMARY OF INVENTION

The present disclosure provides a semiconductor laser diode that may address the problems of the prior art and produce a laser light emitting device with low current threshold. The present disclosure provides a multiple quantum well structure for an active region of a laser light emitting device. The active region may emit visible light, and may overcome impracticalities found in previous conventional devices. For example, the active region of a device of an embodiment of the present disclosure includes two quantum well regions, in which the quantum well closest to n-side semiconductor has an increased band gap compared to the quantum well region closest to the p-side semiconductor. The device including this quantum well structure for the active region may provide low threshold current, long lifetime, and high wall-plug-efficiency.

In an aspect of the present disclosure, a group III nitride based laser diode includes: an n-side group III nitride based semiconductor region; a p-side group III nitride based semiconductor region; and a group III nitride based active region between the p-side group III nitride based semiconductor region and the n-side group III nitride based semiconductor region, the group III nitride based active region including first and second quantum well layers and a barrier layer between the first and second quantum well layers, respective compositions of the first and second quantum well layers including different respective amounts of indium; wherein the first quantum well is closer to the n-side group III nitride based semiconductor region than the second quantum well, the second quantum well is closer to the p-side group III nitride based semiconductor region than the first quantum well, and the first quantum well has a larger band gap than that of the second quantum well.

In some embodiments, the respective band gaps of the first and second quantum wells are determined by the different indium amounts of the first and second quantum wells.

In some embodiments, the first quantum well layer is $In_{x1}Ga_{1-x1}N$, where $0<x1<1$; and the second quantum well layer is $In_{x2}Ga_{1-x2}N$, where $0<x2<1$. In some embodiments, an indium amount ratio x2/x1 is 1.05 to 5. In some embodiments, an indium amount ratio x2/x1 is 1.2 to 5. In some embodiments, an indium amount ratio x2/x1 is 1.05 to 3. In some embodiments, an indium amount ratio x2/x1 is 1.2 to 3.

In some embodiments, a threshold current density of the laser diode is at least 1000 A/cm$^2$.

In some embodiments, a thickness of the barrier layer is at least 5 nm.

In some embodiments, the barrier layer includes a larger band gap than the first and second quantum well layers.

In some embodiments, a thickness of the barrier layer is 30 nm or less.

In some embodiments, the lasing wavelength is at least 450 nm and 550 nm or less.

In some embodiments, the lasing wavelength is at least 500 and 550 nm or less.

In some embodiments, the n-side group III nitride based semiconductor region includes an InGaN guide layer. In some embodiments, a thickness of the InGaN guide layer is at least 80 nm and 300 nm or less. In some embodiments, a thickness of the InGaN guide layer is at least 120 nm and 300 nm or less. In some embodiments, a thickness of the InGaN guide layer is at least 160 nm and 300 nm or less.

In some embodiments, the InGaN guide layer is non-doped.

In some embodiments, the group III nitride based active region further includes a cap layer of InGaN, the cap layer located between the first quantum well layer and the InGaN guide layer. In some embodiments, a thickness of the cap layer is at least 3 nm and 30 nm or less.

DESCRIPTION OF REFERENCE NUMERALS

100: light emitting diode device
101: buffer layer
102: n-contact layer
103: buffer layer
104: n-cladding layer
105: n-guide layer
106: active region
107: carrier blocking layer
108: n-guide layer
109: p-cladding layer
110: p-contact layer
111a: metal electrode layer
111b: metal electrode layer
112: substrate
113: n-side semiconductor region
114: p-side semiconductor region
115: quantum well layer
116: quantum barrier layer
200: light emitting diode device
201: n-cladding layer
202: n-guide layer
203: guide layer
204: active region
205: guide layer
206: carrier blocking layer
207: p-cladding layer
208: contact layer
209a: metal layer electrode
209b: metal layer electrode
210: substrate
211: insulating layer
212: n-side semiconductor region
213: p-side semiconductor region
214: barrier layer (cap layer)
215: well layer
216: barrier layer
217: well layer
218: barrier layer (cap layer)

DETAILED DESCRIPTION OF INVENTION

The present disclosure provides an active region of a semiconductor laser diode (e.g., a group III nitride-based laser light emitting diode). The active region may include two quantum well regions in which the quantum well closest to n-side semiconductor region has an increased band gap compared to the band gap of the quantum well region closest to the p-side semiconductor region. The device including the multiple quantum well structure for the active region may provide low threshold current, long lifetime, and high wall-plug-efficiency.

Figure 2A:
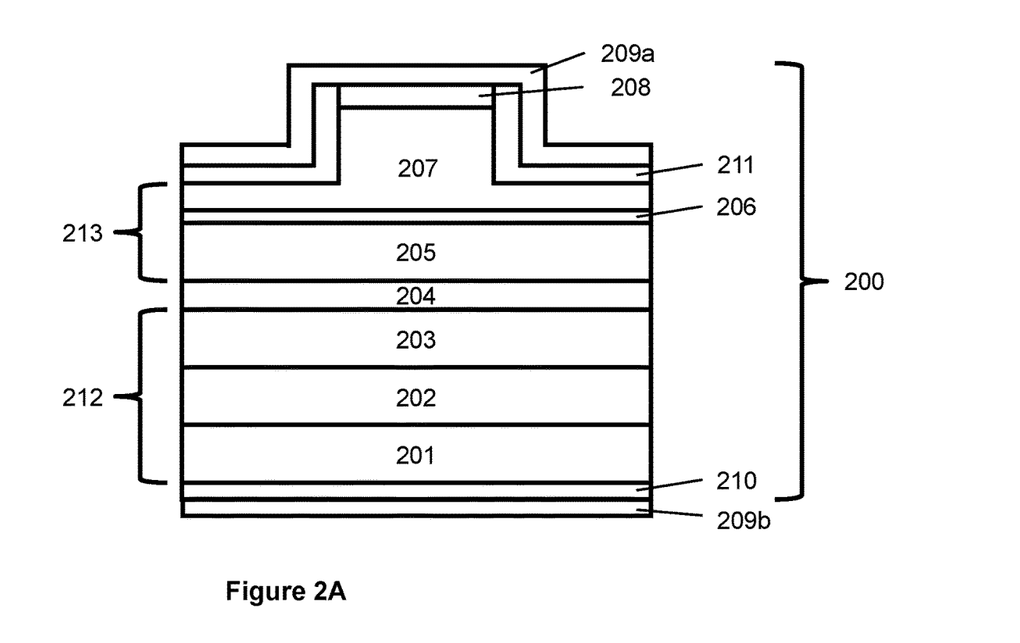
FIG. 2A shows a schematic representation of a layer structure of a device according to an exemplary embodiment of the present disclosure.
Figure 2B:
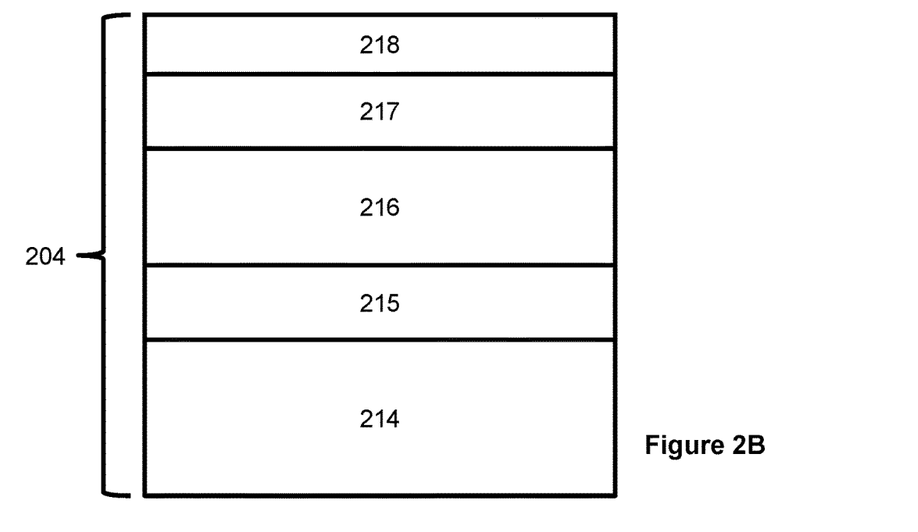
FIG. 2B shows a schematic representation of a layer structure of the active region of a device according to an exemplary embodiment of the present disclosure.

Turning now to FIGS. 2A and 2B, an exemplary embodiment of a semiconductor laser diode (e.g., a group III nitride-based laser light emitting diode) device including the active region is shown at 200. The group III nitride-based laser light emitting diode device includes an n-side (group III nitride-based) semiconductor region 212, a p-side (group III nitride-based) semiconductor region 213, and a (group III nitride-based) active region 204 between the p-side semiconductor region 213 and the n-side semiconductor region 212. The active region 204 includes a plurality of (e.g., first and second) stacked group III nitride-based quantum well layers 215, 217 interspersed with barrier layers 214, 216, 218 as shown in FIG. 2B.

In some embodiments, one or more of the layers of the n-side semiconductor region 212 are n-type doped layers, while other layers of the n-side semiconductor region are not n-type doped layers. In other embodiments, all of the layers of the n-side semiconductor region 212 may be n-type doped.

In some embodiments, one or more of the layers of the p-side semiconductor region 213 are p-type doped layers, while other layers of the p-side semiconductor region are not p-type doped layers. In other embodiments, all of the layers of the p-side semiconductor region 213 may be p-type doped.

A device of the present disclosure, such as that shown in FIGS. 2A and 2B, may be obtained by any suitable means such as Metal-Organic Chemical Vapour Deposition (MOCVD), Molecular Beam Epitaxy (MBE), or any other suitable deposition method(s). The device layers may be deposited on any suitable substrate 210 which may include but is not limited to: GaN, Silicon, Sapphire or SiC. To produce the n-type semiconductor, Si, Ge, O, S, Se may be used as the dopant. To produce the p-type semiconductor, Be, Cd, Mg may be used as the dopant.

Referring to FIG. 2B, the quantum well layers 215 and 217 may have respective compositions and may each include a first element. In some embodiments, the first element may be indium. In an example, the two nitride-based quantum well layers (215,217) are (Al, In, Ga)N semiconductor alloys and each include In. In some embodiments, the composition of one or both of the first and second quantum well layers is InGaN. The composition of the respective quantum well layers may differ among one another with respect to the amount of the first element (e.g., In). The variation in the respective compositions of the quantum well layers 215, 217 may be dependent on the position of the quantum well layer within the active region 204. In some embodiments, the first element may be indium and the composition for a quantum well layer 215 closer to n-side semiconductor region 212 may include a lower amount of indium as compared with the amount of indium in the composition of the quantum well layer closer to p-side semiconductor region 213. Hence, the quantum well layers (215, 217) may have a composition including a first element (In) which is dependent on the position of the quantum well layer within the active region 204. In such embodiments, and as illustrated by FIG. 2C, the amount of In x1 of the first quantum well layer 215, located relatively closer to the n-side semiconductor region 212, is lower compared to the amount of In x2 of the second quantum well layer 217 which is closer to the p-side semiconductor region 213.

Figure 2C:
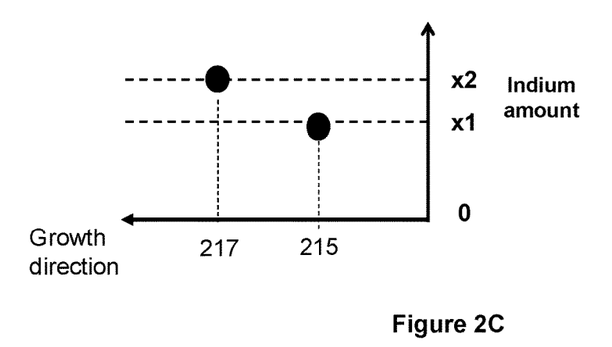
FIG. 2C shows a graph illustrating the respective amounts of indium in the quantum well layers of the active region of a device according to an exemplary embodiment of the present disclosure.
Figure 2D:
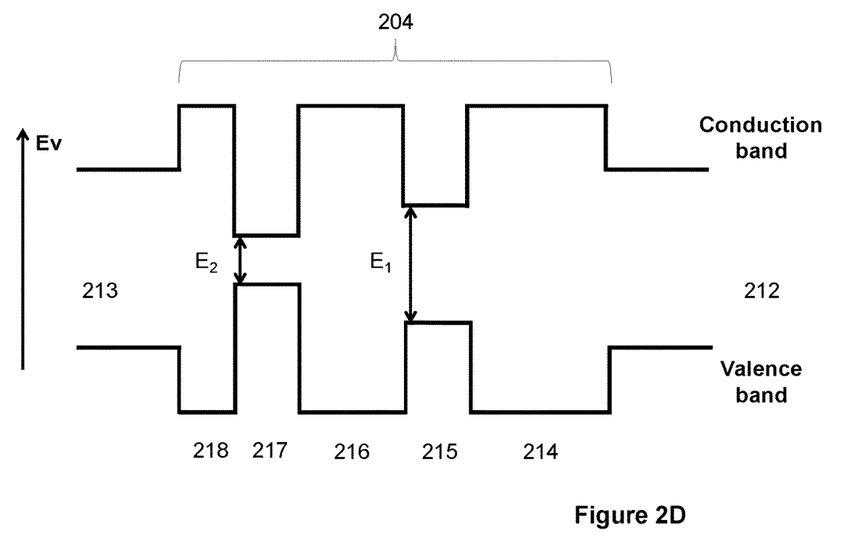
FIG. 2D shows a graph illustrating an energy band structure of layers in the active region of a device according to an exemplary embodiment of the present disclosure.

FIG. 2D depicts the corresponding energy levels for charge carriers (i.e. electrons and holes) within the active region 204. Electron energy is indicated by the energy of the conduction band, and hole energy is indicated by the energy of the valence band. The energy band gap E1 of the first quantum well layer 215 and energy band gap E2 of the second quantum well layer 217 are indicated. In the example where the composition of each of the first and second quantum well layers is InGaN, the energy band gap of the InGaN alloy material is dependent on the amount of the first element In in the alloy. The energy band gap of InN (~0.7 eV) is lower than that of GaN (~3.4 eV),I It therefore follows that increasing amount of the first element In in an InGaN alloy layer leads to reduced energy band gap in said layer. In some embodiments, the composition of one or more of the barrier layers is InGaN, where the amount of In is less than the In amount in either of the first and second quantum well layers. In some embodiments, the composition of one or more of the barrier layers is GaN.

As depicted in FIGS. 2C and 2D, the indium amount in the composition is lower for the first quantum well layer 215 compared to the second quantum well layer 217. This results in band gap E1 of the first quantum well layer 215 being comparatively larger than the band gap E2 for the second quantum well layer 217.

As described above, an active region 204 fabricated in the (Al, In, Ga)N material system includes a multiple quantum well 215, 217 and quantum barrier layers 214, 216, 218 structure. The active region 204 is surrounded by a p-side semiconductor region 213 and an n-side semiconductor region 212. This provides the structure of a semiconductor laser diode device.

In n-side semiconductor regions, the majority of charge carriers are electrons; and in p-side semiconductor regions, the majority charge carriers are holes. Under electrical excitation, holes may be injected to the active region 204 from the p-side semiconductor region 213 and electrons may be injected to the active region 204 from the n-side semiconductor region 212. The term "injected" is used herein to denote transport of charge carriers from origination in the p-side semiconductor region or the n-side semiconductor region to another layer within the device, under some electrical excitation applied across the device. These electron and holes (charge carriers) may accumulate in the quantum wells (215, 217) due to the lower energy levels compared to the adjacent barrier layer (216). Further transport of charge carriers to quantum wells furthest from the injection layer (p-side or n-side semiconductor region 213 and 212) is limited by the quantum barrier layers. Therefore, the quantum well 215 close to the n-side semiconductor region 212 may have a higher concentration of electrons than the quantum well 217 close to the p-side semiconductor region 213 under a given operating condition. Analogously, the quantum well 217 closer to p-side semiconductor region 213 may have a higher hole concentration than the quantum well 217 close to n-side semiconductor region 212. It is known in the art that in a (Al,In,Ga)N material system, hole mobility is lower than electron mobility.

The operation of the semiconductor laser diode device of the present disclosure may be characterised by recombination of charge carriers in the active region. Recombination processes can be radiative or non-radiative. Radiative recombination denotes that energy released by recombination of one electron with one hole is transferred to a photon with energy equivalent to that lost by the recombining electron and hole. Non-radiative recombination refers to all the other mechanisms which release energy from electron and hole in a non-radiative way such as carrier leakage, phonon recombination, recombination with defects or impurities in the material etc. The wavelength of the light emitted by the nitride semiconductor laser diode device of the present disclosure is therefore determined by the energy of the photon released when an electron and hole recombine by a radiative process as described above.

Figure 3A:
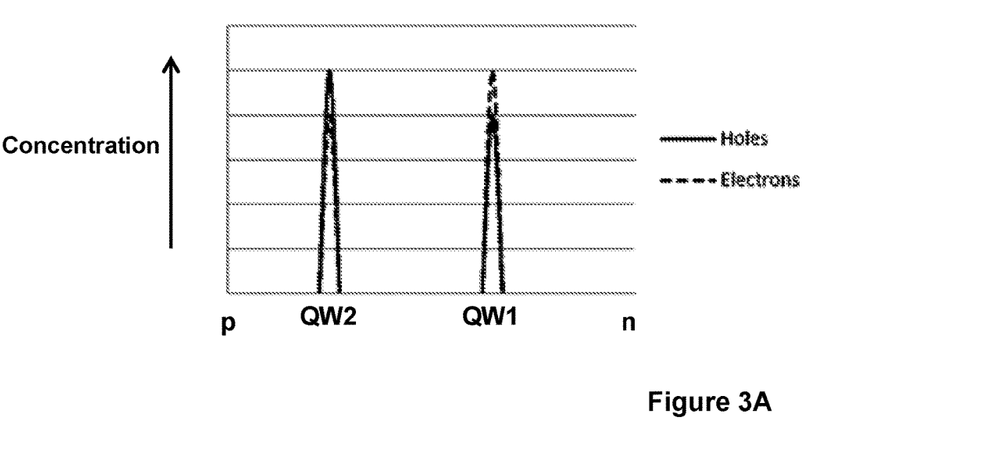
FIG. 3A shows a graph illustrating a concentration of charge carriers in quantum well layers of a conventional nitride laser diode device emitting with an emission wavelength around 405 nm, obtained from a calibrated laser simulation.

FIG. 3A illustrates the carrier concentration in a conventional double quantum well (QW1 and QW2) active region structure for conventional laser emitting device (e.g., similar to that shown in FIGS. 1A-1D) with an emission wavelength around 405 nm. FIG. 3A shows that the non-uniform distribution of carrier concentration across the quantum wells is particularly pronounced for hole concentration due to comparatively lower mobility compared to electrons.

For the purpose of achieving a nitride laser emitting device with a longer wavelength emission for the device discussed in FIG. 3A, the energy difference between the electron and the hole which recombine must be comparatively lower. This implies that the energy band gap of the layer or layers in which the recombination takes place must be comparatively lower. The comparatively lower band gap of the quantum well layers increases the relative potential height of the adjacent barrier layers, which more strongly confines charge carriers to the quantum well(s) closest to the layer from which they have been injected into the active region. Therefore, transport of carriers to layers beyond the barrier to quantum well(s) farthest from the layer from which they have been injected into the active region is comparatively reduced. As exemplified in FIG. 3B (showing a comparison to that in FIG. 3A of both carrier types in a double quantum well active region), comparatively lower band gap for quantum wells emitting in the blue/green spectrum leads to comparatively greater non-uniformity in distribution of both carrier types across the two quantum well layers.

Lasing light emission is achieved when radiative recombination rate from carrier recombination in the active region reach a level which is able to compensate for optical losses of the optical cavity. This corresponds to a threshold carrier concentration under a high electric excitation also known as threshold current (current corresponding to the amount of carrier flow through under the electrical excitation across the device). For lasing to be achieved, the carrier concentration threshold must be met for both carrier types in the same quantum well layer. Threshold current may also be expressed in current density, which is calculated by dividing threshold current by the area of the laser diode device parallel to the active region in which electrical current flows. The area is commonly calculated as the width of the ridge defined by p-GaN contact layer 208 and the distance between the mirror surfaces defined by cleavage of the semiconductor layer sequence.

If non-uniformity of carrier concentration exists between the quantum wells, the lasing process will be achieved at different current density for each quantum well layer. In laser diode devices formed of (Al,In,Ga)N, the threshold carrier concentration is higher compared to other material systems, such as (Al,In,Ga)As. As such, threshold current density of (Al,In,Ga)N laser diode devices is typically 1000 A/cm$^2$ or higher.

Figure 3B:
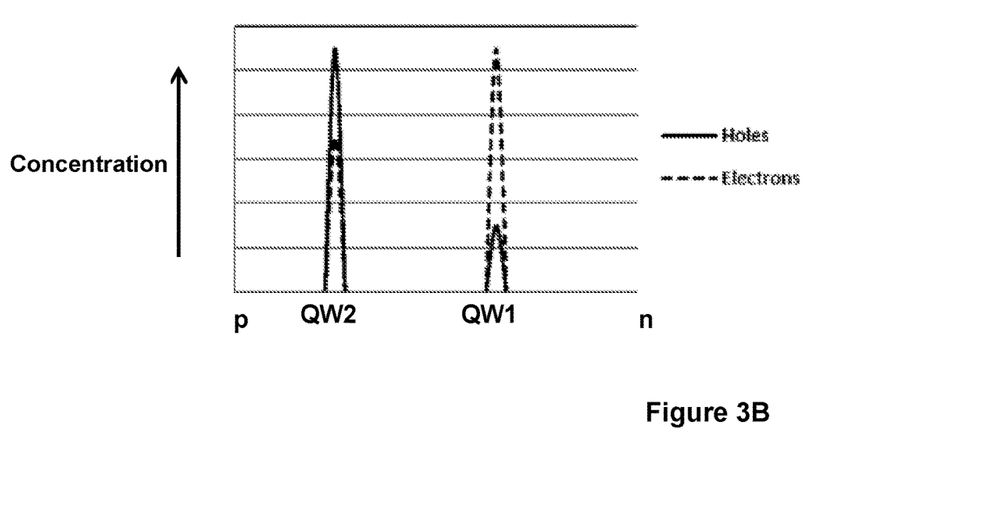
FIG. 3B shows a graph illustrating a concentration of charge carriers in quantum well layers of a conventional nitride laser diode device emitting with an emission wavelength >450 nm, obtained from a calibrated laser simulation.

Referring to FIG. 3A and FIG. 3B, the minimum concentration of either electrons or holes is comparatively higher in the quantum well layer QW2 than the quantum layer QW1 for a given operating condition. Therefore, the carrier concentration threshold is achieved at a lower current in the quantum well layer QW2. The current required to achieve the carrier concentration threshold in the quantum well layer QW1 may be comparatively significantly higher than the current required to achieve the carrier concentration threshold in the quantum well layer QW2.

In an embodiment of the present disclosure, and with reference to FIG. 2B, the active region may be configured such that laser light emission is achieved only for the second quantum well layer 217. In said embodiment, the limiting process for onset of laser light emission is electron injection to the second well 217 due to comparatively lower concentration of electrons than holes at a given operating condition. With further reference to FIG. 2D, the band gap E1 of the first quantum well layer 215 is increased compared to the band gap E2 of the second quantum well layer 217, resulting in improved electron injection to the second quantum well layer 217 and a lower threshold current for laser light emission from the device.

In the art, efforts have been made to reduce the extent of non-uniformity in active regions including multiple quantum well layers. By reducing non-uniformity, light emission from more than one quantum well is expected. However, simulation of such structures has shown that under a desirable operating condition, light emission remains comparatively significantly higher in quantum well(s) closest to the p-side semiconductor.

In the structure of the present disclosure, the carrier threshold condition is intentionally met only in the second quantum well layer 217 and laser light emission is only from the second quantum well layer 217. Therefore, the energy of photons generated by laser light emission process may be determined by the energy band gap E2 of the second quantum well layer 217, and may not depend on the energy band gap E1 of the first quantum well layer 215. It therefore follows that changes to the properties of the first quantum well layer 215 such as amount of a first element in the composition may not affect the characteristic of laser light emitted by the structure. Changes to the properties of the first quantum well layer 215 may be made to improve electrical and efficiency characteristics of the device.

For a semiconductor laser diode device to achieve lasing operation, its structure should provide confinement of the carrier recombination and emitted photons to an active region. With continued reference to FIG. 2A, light confinement in the direction perpendicular to the active region direction may be achieved by arranging guide layers 202, 203 below and p-guide layer 205 above the active region 204, each of the guide layers 202, 203, 205 having a refractive index higher than the effective index of the guided light. Further confinement may be achieved by arranging n-cladding layer 201 below and p-cladding layer 207 above the active region, each of cladding layers 201, 207 having a refractive index lower than the effective index of the guided light. The structure of the present disclosure with the guide layers 202, 203, 205 and the cladding layers 201, 207 as described above may provide light confinement in the direction perpendicular to the active region. In an example, the guide layers 202, 203, 205 and/or the cladding layers 201, 207 may be (Al, In, Ga)N semiconductor alloys.

The refractive index of InN is comparatively higher compared to the refractive index of GaN. It follows that the refractive index of InGaN material will increase with increasing In amount. This increase may or may not be linear. Furthermore, at wavelengths longer than 450 nm the refractive index of GaN and InN both decrease with increasing wavelength such that the refractive index contrast between GaN and InN is reduced at longer wavelength. It follows that refractive index contrast between GaN and InGaN, for a chosen In amount, is reduced at longer wavelength.

The refractive index of AlN is comparatively lower compared to the refractive index of GaN. It follows that the refractive index of AlGaN material will decrease with increasing Al amount. This decrease may or may not be linear. Furthermore, at wavelengths longer than 450 nm the refractive index of AlN increases with increasing wavelength such that the refractive index contrast between GaN and AlN is reduced at longer wavelength. It follows that refractive index contrast between GaN and AlGaN, for a chosen Al amount, is reduced at longer wavelength.

Between the upper guide layer 205 and upper cladding layer 207, a carrier blocking layer 206 is provided, which has a higher band gap compared to adjacent layers 205 and 207. This layer may reduce transport of electrons from the guide layer 205 to the cladding layer 207 and may not strongly impact transport of holes from cladding layer 207 to guide layer 205.

As exemplified in FIG. 2A, the upper cladding layer 207 may have a shaped upper surface, for example, formed by post-growth processing. In a typical layout, the shaped upper surface may be a ridge formed in the plane of growth, which additionally confines light propagation to the direction of the longest dimension of the ridge. In the example shown, a p-type GaN contact layer 208 is formed on top of the upper cladding layer 207 prior to post-growth processing, to aid electrical contact. Electrical contact is made to the substrate 210 and electrical contact is made to p-type GaN 208 by metal layer electrodes 209a and 209b, which allows the device to be electrically activated. An insulating layer 211 is formed between the upper cladding layer 207 and metal layer electrode 209a such that injection of charge carriers to the device only occurs in the area defined by the p-type GaN contact layer 208 that coincides with the shaped ridge.

In an embodiment of the present disclosure, two mirror surfaces are provided by cleavage (or other methods) of the semiconductor layer structure perpendicular to the longest dimension of the ridge and to the active region layer structure to confine the light in the direction parallel to the active region 204. The two mirror surfaces together may define an optical cavity. The mirror surfaces can be treated for example by deposition of a further other material (e.g. SiNx, $SiO_2$, $Al_2O_3$) to alter the refractive index property in order to change their mirror reflectivity to the laser light emission. Light may escape by transmission through these surfaces and this light may be used for the intended application. In this described arrangement, the device is said to be edge emitting, the edge being defined as perpendicular to active region layer structure and the longest dimension of the ridge. The arrangement of the optical cavity of the laser emitting device may also be defined parallel to the active region layer structure, resulting in a vertically emitting laser device.

Quantum wells 215, 217 may be comprised of InGaN material and may include In in respective amounts x1 and x2 in the range $0<x1\leq1$ and $0<x2\leq1$. The quantum barrier layer 216 may comprise $In_yGa_{1-y}N$ material and may include In in an amount y in the range $0\leq y<1$ and satisfying $y<x1$ and $y<x2$. But in some embodiments, the quantum barrier layer 216 may not include In. This may improve crystal quality and/or improve growth quality of the second quantum well 217. The barrier layer 216 may have a larger band gap than the first and second quantum well layers.

Quantum barrier layers 214, 218 (also referred to herein as cap layers) may include $In_zGa_{1-z}N$ and may include In in an amount z in the range $0\leq z<1$ and satisfying $z<x1$ and $z<x2$. But in some embodiments, one or both of the quantum barrier layers 214, 218 may not include In. This may improve crystal quality of these layers and/or provide a smooth surface for growth of subsequent layers.

In some embodiments, a thickness of each of the quantum well layers 215, 217 may be at least 1 nm and less than 10 nm. In some embodiments, a thickness of each of the quantum barrier layers 214, 216 may be at least 5 nm and less than 30 nm. In some embodiments, a thickness of the quantum barrier layer 218 may be at least 1 nm and less than 30 nm.

In some embodiments, the active region 204, comprised of quantum well layers 215 and 217, quantum barrier layer 216, and cap layers 214 and 218, is non-doped. Introduction of dopants, such as but not limited to, Si or Mg (commonly used in (Al,In,Ga)N material system) can in some embodiments reduce the crystal quality which would then impact the device performance. However non-doped layers may have the effect of reducing the injection of carriers to the quantum wells and increasing threshold current. Accordingly, in some embodiments, one or more of the layers within the active region 204 may be doped (e.g., by one or more dopants such as but not limited to Si, Ge, O, S, Se, Be, Cd, Mg).

In embodiments wherein the bandgap E1 of the first quantum well layer 215 is larger than the bandgap E2 of the second quantum well layer 217, the amount of Indium x1 of the first quantum well layer 215 of $In_{x1}Ga_{1-x1}N$ material is different from the amount of Indium x2 of the second quantum well layer 217 of $In_{x2}Ga_{1-x2}N$ material. This difference may be defined by the Indium amount ratio x2/x1. In some examples, the ratio x2/x1 is equal to 1.05 or greater. In other examples, the In amount ratio x2/x1 of first and second quantum wells is equal to 1.2 or greater. In other examples, the In amount ratio x2/x1 of first and second quantum wells is equal to 2 or greater.

In some embodiments, the wavelength of the laser light emitted by the device of the present disclosure, as determined by the energy gap E2 of the second quantum well layer 215, is at least 450 nm. In this case it has been found that the use of a lower amount of indium x1 in the composition of the first quantum well layer 215 is preferable to reduce threshold current of the laser emitting device.

In some embodiments, the wavelength of the laser light emitted by the device of the present disclosure is at least 500 nm. Under these conditions, the threshold current of such laser device according to this embodiment can be reduced by lowering the amount of In x1 of the first quantum well layer 215 according to the present disclosure in comparison to a laser device prepared without lowering the amount of In x1 of quantum well layer 215.

Decreased threshold current may have a positive impact on wall-plug-efficiency (WPE) as calculated by the ratio of useful light energy output to the electrical energy input expressed as a percentage. In some embodiments, the wavelength of the laser light emitted by the device of the present disclosure is 550 nm or less.

In an exemplary embodiment of the present disclosure, wavelength emission of the semiconductor laser diode device is at least 450 nm. The cladding layers 201, 207 may be AlGaN and may not have all equal amounts of Al. The guide layers 202, 203, 205 may be InGaN and may not have all equal amounts of In. As it is been described, the refractive index of the cladding layers 201,207 and the guide layers 202,203,205 will reduce when the wavelength light emission of the active region is increased, and therefore the refractive index difference between guide layers 202,203, 205 and cladding layers 201,207 will decrease. This may result in a reduced confinement of light of the laser light emitting device and may impact the device performance. Therefore, in some embodiments, it may be preferable to set the In amount in the InGaN guide layer 205 to 2% or more by atom fraction. In this case, a difference in conduction band energy is created between the second quantum well cap layer 218 and the InGaN guide layer 205. This may reduce hole injection and create an accumulation of holes at the interface between these layers. As the effect of the present disclosure is to increase the transport of electrons toward the second quantum well layer 217, it also increases the transport into the InGaN guide layer 205. It therefore may also be preferable that the In amount ratio x2/x1 differs by a factor of 5 or less as otherwise significant recombination of electrons and holes occurs in $In_xGa_{1-x}N$ guide layer 205, reducing injection of holes to the active region 204. In some embodiments, the In amount ratio differs by a factor of 3 or less.

In some embodiments, the InGaN guide layer 205 is p-type doped. This may improve the electrical performance of the laser device.

In another exemplary embodiment of the present disclosure, wavelength emission of the semiconductor laser diode device is at least 450 nm. As it has been described, the refractive index of the cladding layers 201,207 and the guide layers 202,203,205 will reduce and therefore the refractive index difference between guide 202,203,205 and cladding layers 201,207 will decrease. This may result in a reduced confinement of light of the laser light emitting device and may impact the device performance. Therefore, in some embodiments, it may be preferable to set the thickness of InGaN guide layer 203 to 80 nm or more, and the In amount to 2% or more by atom fraction. With these properties, the crystal quality of the InGaN guide layer 203 may be reduced, which may negatively impact the crystallinity of the active region, in particular the quantum wells, leading to an increase in threshold current. Accordingly, by lowering the In amount x1 of the first quantum well 215, the crystallinity of the second quantum well 217 can be improved and threshold current density reduced. This structure may be preferable when the InGaN guide layer 203 thickness exceeds 120 nm. Furthermore, this structure may be particularly preferable when the InGaN guide layer 203 thickness exceeds 160 nm. In some embodiments, the InGaN guide layer 203 thickness is 300 nm or less.

The semiconductor laser diode device of the present disclosure may include a quantum barrier layer 216 arranged between the first quantum well layer 215 and second quantum well layer 217. In an embodiment, the quantum barrier layer 216 thickness is larger than 5 nm. As the quantum barrier layer 216 thickness is increased, defects which exist in the epitaxially grown material originating from the first quantum well layer 215 can be removed, which is preferable for improving the crystal quality of the second quantum well layer 217. However as the quantum barrier layer 216 thickness is increased, injection of electrons to the second quantum well layer 217 may also be negatively impacted. Lowering the In amount x1 of the first quantum well 215 can improve electron injection to the second quantum well layer 217. In some embodiments, the quantum barrier layer 216 thickness is 30 nm or less (and larger than 5 nm).

As shown in FIG. 2A, the device of the present disclosure may have a cap layer 214 formed below the first quantum well 215. The cap layer 214 may improve crystal quality of the subsequent quantum well layer 215. The cap layer 214 may be comprised of $In_{z1}Ga_{1-z1}N$ with an amount of In z in the range $0 \leq z1 < 0.05$, satisfying $z1 < x1$ and $z1 < x2$. In some embodiments, the cap layer 214 is non-doped to maintain high crystal quality. When the In amount z1 of the cap layer 214 is equal to zero, a layer with very high crystal quality can be fabricated. When the In amount z1 of the cap layer 214 is greater than zero, electron injection to the active region may be improved, but crystal quality of the subsequent layer 215 may be reduced. In some embodiments, the amount of In z1 of the cap layer 214 may be 0.05 or less.

When a laser diode structure includes a cap layer 214 it was found that by setting the amount of In x1 of the first quantum well 215 lower than amount of In x2 of the second quantum well 217, the threshold current of this laser emitting device may be improved in comparison to a similar structure without features of the first and second quantum wells in accordance with the present disclosure.

In some embodiments, to achieve improvement in crystal quality of the first quantum well layer 215, the thickness of the cap layer 214 is at least 3 nm. In some embodiments, the thickness of the cap layer is 30 nm or less and at least 3 nm.

In some embodiments, the InGaN guide layer 203 is n-type doped. This may improve the electrical performance of the laser device.

In some embodiments, the InGaN guide layer 203 is non-doped. This may improve the crystallinity of the active region. Under these conditions, the threshold current of such laser device according to this embodiment can be reduced by lowering the amount of In x1 of the first quantum well layer 215 according to the present disclosure in comparison to a laser device prepared without lowering the amount of In x1 of quantum well layer 215.

Examples

Examples of the embodiments of the device of the present disclosure are now described, although such examples are not intended to be limiting in any respect.

A first exemplary embodiment of the semiconductor laser diode is described with reference to FIGS. 2A and 2B. A semiconductor laser diode device produces light with a wavelength in the range 440 nm to 460 nm. The laser diode device includes a substrate 210 of free-standing GaN. On the substrate 210 an n-$Al_{0.04}Ga_{0.96}N$ cladding layer 201 with thickness 1000 nm and n-dopant Si concentration 5e18 $cm^{-3}$ is formed. On the cladding layer 201 an n-GaN guide layer 202 with thickness 400 nm and n-dopant Si concentration 5e18 $cm^{-3}$ is formed. On the n-GaN guide layer 202 an $In_{0.025}Ga_{0.975}N$ guide layer 203 with thickness 80 nm and n-dopant Si concentration 1e18 $cm^{-3}$ is formed.

On the guide layer 203, a laser light emitting active region 204 is formed which comprises (as described in FIG. 2B), a lower cap layer 214 of GaN with thickness 10 nm, a first quantum well layer 215 of $In_{0.08}Ga_{0.92}N$ with thickness 2.5 nm, a barrier layer 216 of GaN with thickness 10 nm, a second quantum well 217 of $In_{0.16}Ga_{0.84}N$ with thickness 2.5 nm and an upper cap layer 218 of GaN with thickness 2 nm. The In amount ratio of the quantum wells of this example is equal to 2. On the active region 204 an In$_{0.025}$Ga$_{0.975}$N guide layer 205 with thickness 100 nm is formed. On the guide layer 205 a p-Al$_{0.2}$Ga$_{0.8}$N carrier blocking layer 206 with thickness 10 nm and p-dopant Mg concentration 5e19 cm$^{-3}$ is formed. On the carrier blocking layer 206 a p-Al$_{0.04}$Ga$_{0.96}$N cladding layer 207 with thickness 500 nm and p-dopant Mg concentration 1e19 cm$^{-3}$ is formed. On the cladding layer 207 a p-GaN contact layer 208 with thickness 100 nm and p-dopant Mg concentration 1e19 cm$^{-3}$ is formed.

The p-Al$_{0.04}$Ga$_{0.96}$N cladding layer 207 and p-GaN contact layer 208 are shaped to form a ridge by some post deposition method. An insulating layer 211 of SiO$_2$ of thickness 50 nm is formed between the p-Al$_{0.2}$Ga$_{0.8}$N cladding layer 207 and metal electrode layer 209a. The metal electrode layers 209a and 209b (for example made of Ni, Cu, Pd, Ad, Ir, Pt, Au, Sc, Ti, V, Cr, Y, Zr, Nb, Mo, La, Hf, Ta, W, Al, Ti) are respectively disposed on the surface of the SiO$_2$ insulating layer 211 and the p-GaN contact layer 208, and the bottom surface of the substrate 210, such that injection of charge carriers only occurs in the area defined by the p-GaN contact layer surface in contact with the metal contact layer.

Two surfaces are formed by cleavage of the semiconductor layer sequence 200 at both ends of the ridge, which act as mirror surfaces, thus forming a laser cavity. One mirror surface has reflectivity 0.9 or higher to light propagating in the laser cavity. The second mirror surface has reflectivity 0.7 or lower to light propagating in the laser cavity, light escaping from this mirror surface is used for the application. Reflection properties of mirror surfaces may be altered for example by deposition of another material layer structure (for example SiO$_2$, SiN$_x$ or Al$_2$O$_3$) on the surface accordingly to well-known techniques. Electrical contact is made to the metal electrode contact layer 209a and 209b to generate electrical excitation to the laser emitting device.

Laser diode devices according to the first exemplary embodiment have a threshold current of 25 mA and a wall plug efficiency of 15% measured when emitting 30 mW of light output power.

A second exemplary embodiment of the semiconductor laser diode is described with reference to FIGS. 2A and 2B. A semiconductor laser diode device produces light with a wavelength in the range 490 nm to 510 nm.

The laser light emitting device includes a substrate 210 of free-standing GaN. On the substrate 210 an n-Al$_{0.05}$Ga$_{0.95}$N cladding layer 201 with thickness 1000 nm and n-dopant Si concentration 5e18 cm$^{-3}$ is formed. On the cladding layer 201 an n-GaN guide layer 202 with thickness 400 nm and n-dopant Si concentration 5e18 cm$^{-3}$ is formed. On the guide layer 202 an In$_{0.03}$Ga$_{0.97}$N guide layer 203 with thickness 160 nm and n-dopant Si concentration 1e18 cm$^{-3}$ is formed.

On the guide layer 203 a laser light emitting active region 204 is formed which comprises, a lower cap layer 214 of GaN with thickness 10 nm, a first quantum well layer 215 of In$_{0.1}$Ga$_{0.9}$N with thickness 2.5 nm, a barrier layer 216 of GaN with thickness 10 nm, a second quantum well 217 of In$_{0.24}$Ga$_{0.76}$N with thickness 2.5 nm and an upper cap layer 218 of GaN with thickness 2 nm. The Indium amount ratio of the two quantum wells 215 and 217 is equal to 2.4. On the active region 204 an In$_{0.03}$Ga$_{0.97}$N guide layer 205 with thickness 150 nm is formed. On the guide layer 205 a p-Al$_{0.2}$Ga$_{0.8}$N carrier blocking layer 206 with thickness 10 nm and p-dopant Mg concentration 5e19 cm$^{-3}$ is formed. On the carrier blocking layer 206 a p-Al$_{0.05}$Ga$_{0.95}$N cladding layer 207 with thickness 500 nm and p-dopant Mg concentration 1e19 cm$^{-3}$ is formed. On the cladding layer 207 a p-GaN contact layer 208 with thickness 100 nm and p-dopant Mg concentration 1e19 cm$^{-3}$ is formed.

The p-Al$_{0.05}$Ga$_{0.95}$N cladding layer 207 and p-GaN contact layer 208 are shaped to form a ridge by some post deposition method. An insulating layer 211 of SiO$_2$ of thickness 50 nm is formed between the p-Al$_{0.2}$Ga$_{0.8}$N cladding layer 207 and metal electrode layer 209a. The metal electrode layers 209a and 209b (for example made of Ni, Cu, Pd, Ad, Ir, Pt, Au, Sc, Ti, V, Cr, Y, Zr, Nb, Mo, La, Hf, Ta, W, Al, Ti) are respectively disposed on the surface of the SiO$_2$ insulating layer 211 and the p-GaN contact layer 208 and on the bottom surface of the substrate 210, such that injection of charge carriers only occurs in the area defined by the p-GaN contact layer surface in contact with the metal contact layer.

Two surfaces are formed by cleavage of the semiconductor layer sequence at both ends of the ridge, which act as mirror surfaces, thus forming a laser cavity. One mirror surface has reflectivity 0.9 or higher to light propagating in the laser cavity. The second mirror surface has reflectivity 0.7 or lower to light propagating in the laser cavity, light escaping from this mirror surface is used for the application. Reflection properties of mirror surfaces may be altered for example by deposition of another material layer structure (for example SiO$_2$, SiN$_x$ or Al$_2$O$_3$) on the surface accordingly to well-known techniques. Electrical contact is made to the metal electrode contact layer 209a and 209b to generate electrical excitation to the laser emitting device.

Laser diode devices according to the second exemplary embodiment have a threshold current of 50 mA and a wall plug efficiency of 5% measured when emitting 30 mW of light output power.

Figure 4:
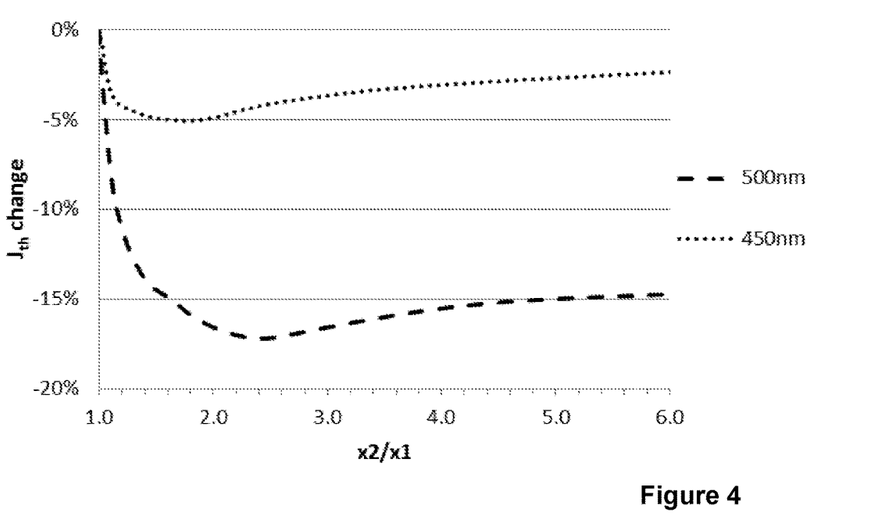
FIG. 4 shows a graph illustrating a change in threshold current density of a laser light emitting device dependent on composition of quantum well layers according to an embodiment of the present disclosure.
Figure 5:
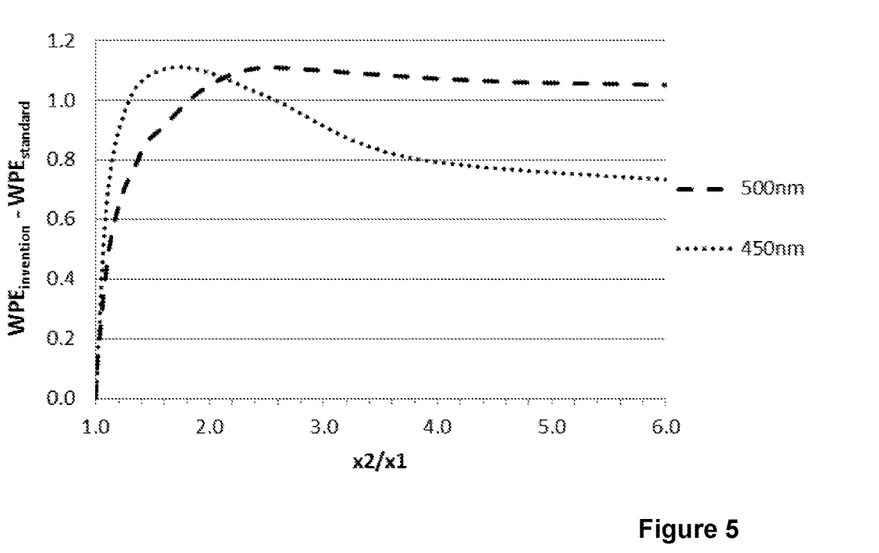
FIG. 5 shows a graph illustrating a change in wall plug efficiency of a laser light emitting device dependent on composition of quantum well layers according to an embodiment of the present disclosure.

The exemplary embodiments described above include the structure of the active region shown in FIG. 2B, in particular that the first quantum well layer 215 located relatively closer to the n-side semiconductor 212 has lower indium amount x1 compared to the second quantum well layer 217 located relatively closer to the p-side semiconductor 213. The structures of the exemplary embodiments provide reduced threshold current density compared to structures where indium amount x1 of the first quantum well layer 215 and x2 of the second quantum well layer 217 are equal. FIGS. 4 and 5 show the threshold current density of the exemplary semiconductor laser diodes.

Referring to FIG. 4 and FIG. 5 the exemplary structure in accordance with the present disclosure for 440 nm-460 nm emission has 7% lower threshold current density ($J_{th}$) and 1.1% higher wall plug efficiency (WPE) at 30 mW light output power compared to a conventional structure that does not utilize the active region of the present disclosure.

Improvements in threshold current and WPE measured on fabricated devices are higher than predicted by simulation experiment, this is because additional benefits of high crystal quality when In amount of the first quantum well is reduced are not accounted for by simulation.

Referring to FIG. 4 and FIG. 5, the exemplary structure in accordance with the present disclosure for 490 nm-510 nm emission has 17% lower threshold current density ($J_{th}$) and 1.1% higher wall plug efficiency at 30 mW light output power compared to a conventional structure that does not utilize the active region of the present disclosure.

Figure 6:
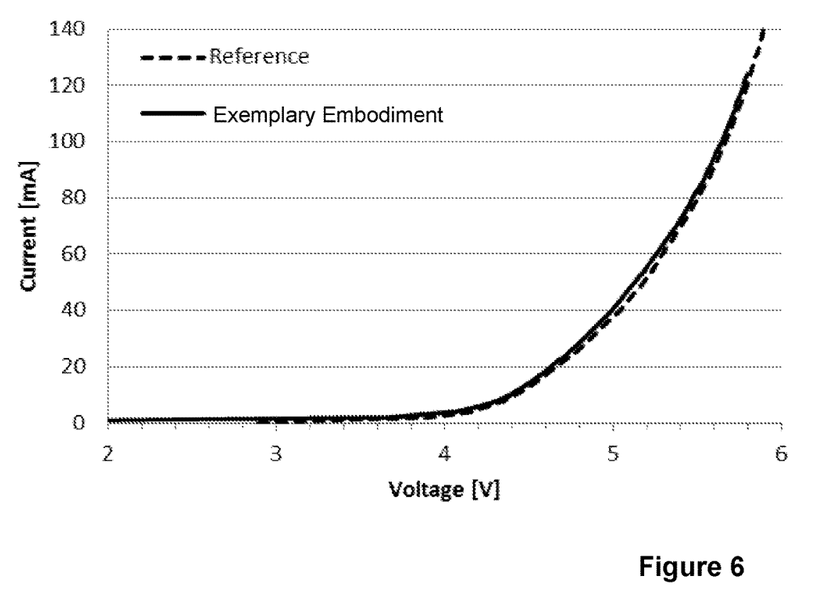
FIG. 6 shows the measured current-voltage characteristic of a reference laser light emitting device and a laser light emitting device according to the present disclosure, with 500 nm-510 nm emission.
Figure 7:
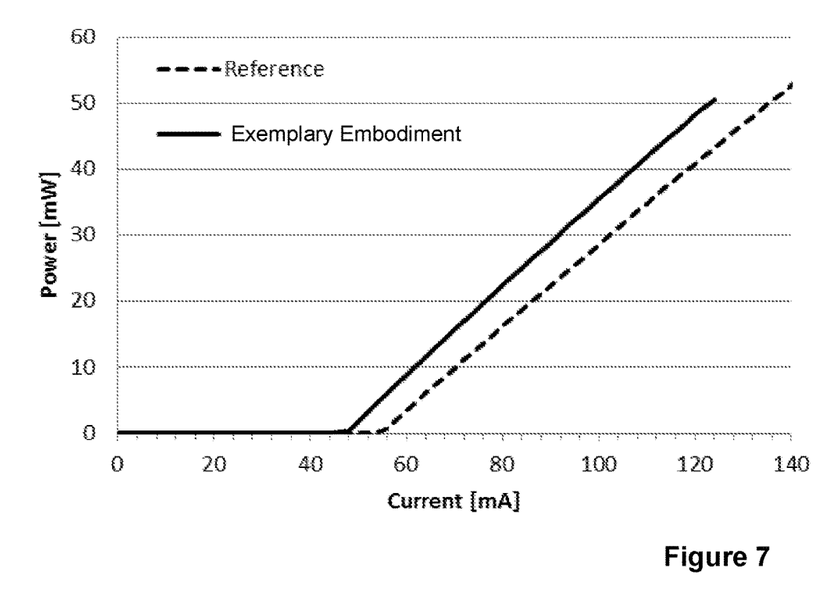
FIG. 7 shows the measured light output power-current characteristic of a reference laser light emitting device and a laser light emitting device according to the present disclosure, with 500 nm-510 nm emission.

FIG. 6 shows the measured current-voltage characteristic of a reference laser light emitting device and a laser light emitting device according to the present disclosure, with 500 nm-510 nm emission. FIG. 7 shows the measured light output power-current characteristic of these devices. In the reference structure, the quantum wells have the same In amount and in the device according to the present disclosure the first quantum well layer has lower In amount compared to the quantum second well layer. The In amount ratio is 1.1

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

A laser diode device in accordance with an embodiment of the present disclosure may be used as a visible light source. Said light sources may be used in illumination or display applications. In particular a laser diode device with low threshold current and high wall plug efficiency is particularly suitable for portable applications where power is delivered from a battery or other limited power source.

What is claimed is:

1. A group III nitride based laser diode, comprising:
   an n-side group III nitride based semiconductor region, the n-side group III nitride based semiconductor region comprising an n-cladding layer and an n-guide layer;
   a p-side group III nitride based semiconductor region, the p-side group III nitride based semiconductor region comprising a p-cladding layer and a p-guide layer; and
   a group III nitride based active region between the p-side group III nitride based semiconductor region and the n-side group III nitride based semiconductor region, the group III nitride based active region comprising first and second quantum well layers and a barrier layer between the first and second quantum well layers, respective compositions of the first and second quantum well layers comprising different respective amounts of indium, an amount of indium of the second quantum well layer being greater than an amount of indium of the first quantum well layer, an indium amount ratio of the indium of the second quantum well layer to the indium of the first quantum well layer being 1.05 to 5;
   wherein the first quantum well is closer to the n-side group III nitride based semiconductor region than the second quantum well, the second quantum well is closer to the p-side group III nitride based semiconductor region than the first quantum well, and the first quantum well has a larger band gap than that of the second quantum well.

2. The laser diode of claim 1, wherein the respective band gaps of the first and second quantum wells are determined by the different indium amounts of the first and second quantum wells.

3. The laser diode of claim 1, wherein:
   the first quantum well layer is $In_{x1}Ga_{1-x1}N$, where $0<x1<1$; and
   the second quantum well layer is $In_{x2}Ga_{1-x2}N$, where $0<x2<1$.

4. The laser diode of claim 1, wherein the indium amount ratio of the indium of the second quantum well layer to the indium of the first quantum well layer is 1.2 to 5.

5. The laser diode of claim 1, wherein the indium amount ratio of the indium of the second quantum well layer to the indium of the first quantum well layer is 1.05 to 3.

6. The laser diode of claim 1, wherein the indium amount ratio of the indium of the second quantum well layer to the indium of the first quantum well layer is 1.2 to 3.

7. The laser diode of claim 1, wherein a threshold current density of the laser diode is at least 1000 A/cm$^2$.

8. The laser diode of claim 1, wherein a thickness of the barrier layer is at least 5 nm.

9. The laser diode of claim 1, wherein the barrier layer comprises a larger band gap than the first and second quantum well layers.

10. The laser diode of claim 1, wherein a thickness of the barrier layer is 30 nm or less.

11. The laser diode of claim 1, wherein the lasing wavelength is within a range of at least 450 nm and 550 nm or less.

12. The laser diode of claim 1, wherein the lasing wavelength is within a range of at least 500 and 550 nm or less.

13. The laser diode of claim 1, wherein the n-guide layer of the n-side group III nitride based semiconductor region is an InGaN guide layer.

14. The laser diode of claim 13, wherein a thickness of the InGaN guide layer is at least 80 nm and 300 nm or less.

15. The laser diode of claim 13, wherein a thickness of the InGaN guide layer is at least 120 nm and 300 nm or less.

16. The laser diode of claim 13, wherein a thickness of the InGaN guide layer is at least 160 nm and 300 nm or less.

17. The laser diode of claim 13, wherein the InGaN guide layer is non-doped.

18. The laser diode of claim 13, wherein the group III nitride based active region further comprises a cap layer of InGaN, the cap layer located between the first quantum well layer and the InGaN guide layer.

19. The laser diode of claim 18, wherein a thickness of the cap layer is at least 3 nm and 30 nm or less.

20. The laser diode of claim 1, wherein the first and second quantum well layers are the only quantum well layers of the group III nitride based active region, and the first and second quantum well layers are configured such that laser light emission is achieved only for the second quantum well layer.

* * * * *